(12) United States Patent  
Osanai

(10) Patent No.: US 7,607,059 B2
(45) Date of Patent: Oct. 20, 2009

(54) SYSTEMS AND METHODS FOR IMPROVED SCAN TESTING FAULT COVERAGE

(75) Inventor: Takeki Osanai, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 358 days.

(21) Appl. No.: 11/533,008

(22) Filed: Sep. 19, 2006

(65) Prior Publication Data

US 2008/0091997 A1    Apr. 17, 2008

(51) Int. Cl.
*G01R 31/28* (2006.01)
(52) U.S. Cl. .................. 714/729; 714/726; 714/728
(58) Field of Classification Search ............ 714/726, 714/729
See application file for complete search history.

(56) References Cited

U.S. PATENT DOCUMENTS

| | | | |
|---|---|---|---|
| 6,687,865 B1 * | 2/2004 | Dervisoglu et al. .......... | 714/726 |
| 7,058,869 B2 * | 6/2006 | Abdel-Hafez et al. ....... | 714/729 |
| 7,266,745 B2 | 9/2007 | Kiryu | |
| 7,308,634 B2 | 12/2007 | Kiryu | |
| 7,441,164 B2 * | 10/2008 | Guettaf ...................... | 714/718 |
| 7,461,309 B2 * | 12/2008 | Kiryu ......................... | 714/729 |
| 7,475,311 B2 | 1/2009 | Kiryu | |
| 7,484,153 B2 | 1/2009 | Kiryu | |
| 2002/0125907 A1 * | 9/2002 | Kurtulik et al. ............. | 324/765 |
| 2005/0240848 A1 * | 10/2005 | Cote et al. ................... | 714/726 |
| 2006/0282732 A1 * | 12/2006 | Kiryu ......................... | 714/738 |

OTHER PUBLICATIONS

U.S. Appl. No. 11/158,601, filed Jan. 11, 2007, Kiryu.
U.S. Appl. No. 11/379,421, filed Nov. 29, 2007, Kiryu.
U.S. Appl. No. 11/377,119, filed Sep. 20, 2007, Kiryu.
U.S. Appl. No. 11/199,972, filed Jul. 19, 2007, Kiryu.
U.S. Appl. No. 11/134,923, filed Dec. 14, 2006, Kiryu.
U.S. Appl. No. 10/961,329, filed Apr. 13, 2006, Kiryu.

* cited by examiner

*Primary Examiner*—John J Tabone, Jr.
(74) *Attorney, Agent, or Firm*—Law Offices of Mark L. Berrier

(57) ABSTRACT

Systems and methods for improved fault coverage of logic built-in-self-tests (LBISTs) in integrated circuits (ICs) which ensure testing of specific logic by forcing specific values into scan latches that contain otherwise pseudorandom test bit patterns. In one embodiment, an LBIST system comprises a plurality of scan latches and forcing logic coupled to a first set of the scan latches which provide inputs to selected target logic. The forcing logic is configured to overwrite values stored in the first set of scan latches with desired values. In one embodiment, the forcing logic includes a bypass path that enables shifting of unaltered bit patterns around the first set of scan latches. Bits in the bypass path may be inverted when the bypass path is not being used in order to help detect errors in the operation of the bypass path.

22 Claims, 9 Drawing Sheets

| Point in Circuit | | Time Step | | | | | | | | |
|---|---|---|---|---|---|---|---|---|---|---|
| | | 1 | 2 | 3 | 4 | 5 | 6 | 7 | 8 | 9 |
| A | forcing signal | 0 | 0 | 0 | 1 | 0 | 0 | 0 | 0 | 0 |
| B | timing OR | 0 | 0 | 0 | 0 | 1 | 1 | 0 | 0 | 0 |
| C | input pattern | a | b | c | d | e | f | g | h | i |
| D | bypass latch | | a | b | c | d | e | f | g | h |
| E | forced latch | | a | b | c | 1 | e | f | g | h |
| F | MUX scan chain input | | | a | b | 1 | 1 | e | f | g |
| G | MUX bypass input | | | ~a | ~b | c | d | ~e | ~f | ~g |
| H | MUX output | | | a | b | c | d | e | f | g |

Fig. 7

SYSTEMS AND METHODS FOR IMPROVED SCAN TESTING FAULT COVERAGE

BACKGROUND

1. Field of the Invention

The invention relates generally to test methods, and more particularly to systems and methods for providing improved fault coverage of scan tests, such as logic built-in-self-tests, in integrated circuits by controlling the data passing through certain components.

2. Related art

As digital devices (e.g., integrated circuits) have become more complex and more densely packed with logic gates and other electronic components, there are more and more opportunities for manufacturing defects to occur, thereby impairing or impeding the proper operation of the devices. Consequently, the testing of these devices is becoming increasingly important. With respect to the testing of devices, and more particularly manufactured integrated circuits (ICs), one mechanism that is very useful is a built-in self test (BIST). This may also be referred to as a logic built-in self test (LBIST).

BIST and LBIST methodologies are generally considered part of a group of methodologies referred to as design-for-test (DFT) methodologies. DFT methodologies involve incorporating features into the actual designs of the circuits to facilitate testing of the circuits. BIST methodologies involve incorporating circuit components into the design of the circuit to be tested, where the additional circuit components are used for purposes of testing the functional portion of the circuitry.

In a typical LBIST system, LBIST circuitry within a device under test includes multiple scan chains interposed between levels of the functional logic of the device. Typically, pseudorandom patterns of bits are generated and loaded into the scan chains. This may be referred to as scanning the data into the scan chains (during a scan shift phase). After a pseudorandom bit pattern is scanned into a scan chain, the data is propagated through the functional logic to a subsequent scan chain (during a functional phase). The data is then scanned out of the subsequent scan chain. The data may be compressed to reduce storage and bandwidth requirements. This test loop is typically repeated many times (e.g., 10,000 iterations,) with the results of each test loop being combined in some manner with the results of the previous test loops. For example, the results may be compared according to values in corresponding multiple input signature registers, or MISR's. After all of the scheduled test loops have been completed, the final result is compared to a final result generated by a device that is known to operate properly operated in an identical test (using identical input data processed identically.) Based upon this comparison, it is determined whether the device under test operated properly.

Because the use of pseudorandom patterns is not deterministic (i.e., it does not test each and every possible combination of inputs, states and outputs), it does not provide the simple result that the logic circuit either does or does not have any defects. Instead, it provides a level of confidence that the logic circuit does or does not have defects. The greater the number of inputs and states that are tested, the higher the confidence level that any defects have been identified by the testing. The number of random test patterns that are needed to achieve a particular level of confidence that the logic circuit contains no defects depends on the design of the logic circuit. This non-deterministic testing approach is typically easier and less expensive to implement than a deterministic approach.

Some components or portions of the circuitry, however, may require a very specific and improbable combination of bits to properly test the circuitry. For example, "large" AND gates have an output of 1 only when all of the inputs to the AND gate are 1's. It is therefore necessary for test purposes to ensure that all of the inputs to the AND gate will, at some point in the testing, be 1's. Because this is unlikely in a pseudorandom sequence of bits, it gives rise to concerns regarding the likelihood that all output states will be exercised during testing.

While it might at first appear to be possible to provide additional logic between the scan latches and the target logic to be tested in order to force the inputs to the target logic to desired values, this may violate timing constraints of the LBIST and/or target logic. For example, in the case of a many-input AND gate, the gate is actually constructed by cascading multiple two-input AND gates. Consequently, the time required for the inputs of the many-input AND gate to propagate through to its output is the sum of the times required for data to traverse each tier of the two-input AND gates that form the many-input AND gate. This time becomes even greater when the many-input AND gate is constructed using a NAND gate and an inverter in place of each two-input AND gate. Placing additional logic between the scan latches and the many-input AND gate may therefore not allow enough time for the data to propagate from the scan latches to the output of the many-input AND gate, causing errors in the testing.

There is therefore a need to provide systems and methods for forcing the values in selected LBIST scan latches to particular values in order to ensure adequate test coverage when a desired bit pattern is unlikely to occur in a pseudorandom bit sequence. There is further a need to provide systems and methods for this purpose, wherein the amount of time required for data to propagate from the scan latches to the output of the target logic is not increased.

SUMMARY OF THE INVENTION

One or more of the problems outlined above may be solved by the various embodiments of the invention. Broadly speaking, the invention comprises systems and methods for improved fault coverage of scan tests, such as logic built-in-self-tests (LBISTs,) in integrated circuits (ICs) which ensure testing of specific logic by forcing specific values into scan latches that contain otherwise pseudorandom test bit patterns.

In one embodiment, an LBIST system comprises a plurality of scan latches and forcing logic coupled to a first set of the scan latches. The scan latches are coupled to corresponding inputs of the target logic being tested, and are configured to receive and store bit patterns that are provided as inputs to the target logic. The forcing logic is configured to overwrite values stored in the first set of scan latches with desired values. In one embodiment, the target logic includes an N-input AND gate and the forcing logic comprises OR gates coupled to the inputs of each of the first set of scan latches. Each OR gate is configured to receive as inputs a forcing signal and an output of a preceding scan latch. The forcing signal may be provided, for example, by an LBIST controller or by one of the latches in the scan chain. When the forcing signal is asserted, each of the first set of scan latches is loaded with a 1. Other embodiments may have different target logic and different forced values which are appropriate for the target logic. In one embodiment, the forcing logic includes a bypass path that enables shifting of unaltered bit patterns around the first set of scan latches. Bits in the bypass path may be inverted when the bypass path is not being used in order to help detect errors in the operation of the bypass path. In one embodiment, the first set of latches may comprise mirror latches that mirror the values in corresponding latches in a scan chain unless the vales in the mirror latches are forced to the desired values.

In another embodiment, a method comprises shifting bit patterns into the latches of an LBIST scan chain and selectively forcing desired values into a first set of the latches (e.g., by overwriting the current values of the latches with the desired values.) In one embodiment, the values stored in the first set of latches are provided to an N-input AND gate. In this embodiment, the values stored in the first set of latches comprise the values output by the respective preceding latches, OR'ed with a forcing signal. Asserting the forcing signal then forces 1's into the latches. The forcing signal may be provided, for example, by an LBIST controller or by one of the latches in the scan chain. The method may also include bypassing unaltered bits of the bit patterns around the first set of latches. The bits in the bypass path may be inverted when the bypass path is not being used. In one embodiment, the first set of latches may comprise mirror latches which mirror the values in corresponding latches of the scan chain unless the forcing signal is asserted.

Numerous additional embodiments are also possible.

BRIEF DESCRIPTION OF THE DRAWINGS

Various advantages of the invention may become apparent upon reading the following detailed description and upon reference to the accompanying drawings.

FIG. 7 is a table of an example input bit pattern propagation in accordance with the embodiment of FIG. 6.

Figure 1:
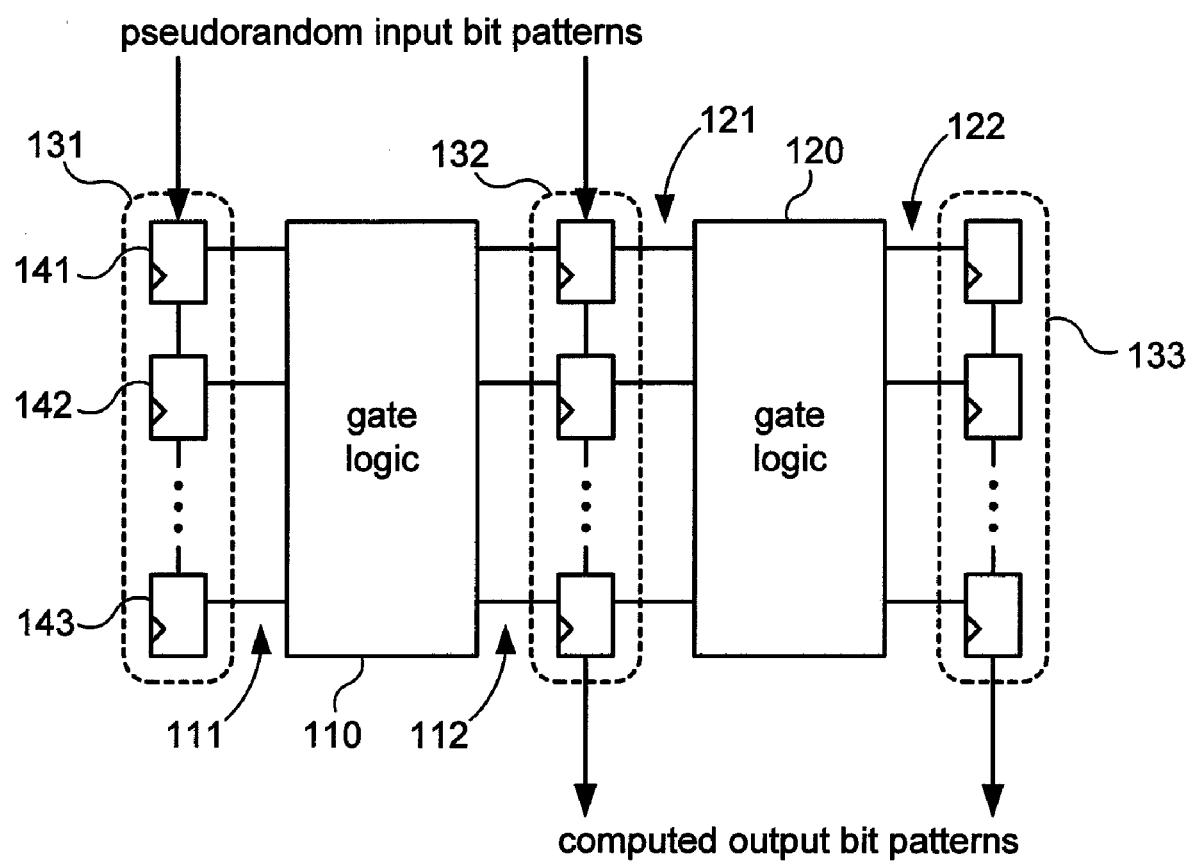
FIG. 1 is a functional block diagram illustrating the principal of operation of a simple STUMPS LBIST system in accordance with one embodiment.

While the invention is subject to various modifications and alternative forms, specific embodiments thereof are shown by way of example in the drawings and the accompanying detailed description. It should be understood, however, that the drawings and detailed description are not intended to limit the invention to the particular embodiments which are described. This disclosure is instead intended to cover all modifications, equivalents and alternatives falling within the scope of the present invention as defined by the appended claims.

DETAILED DESCRIPTION OF EXEMPLARY EMBODIMENTS

One or more embodiments of the invention are described below. It should be noted that these and any other embodiments described below are exemplary and are intended to be illustrative of the invention rather than limiting.

As described herein, various embodiments of the invention comprise systems and methods associated with integrated circuits (ICs) to manage the composition of input test bit patterns to improve the fault coverage of scan tests such as logic built-in-self-tests (LBISTs). While the embodiments described in detail below are implemented in LBIST systems, it should be noted that alternative embodiments may be implemented in systems that implement testing using automated test pattern generators (ATPG's) or other means to generate test patterns for the scan chains. References below to LBIST should therefore be construed broadly to encompass ATPG-based systems and other types of test systems that use scan chains.

The various embodiments of the invention may provide a number of advantages over conventional systems. For example, the coverage of a given number of tests is improved. This improves the level of confidence that defects in the circuitry are detected. Also, for a given level of confidence, the number of tests required can be reduced compared with the number required of conventional methods.

In one embodiment, a STUMPS-type LBIST test architecture is incorporated into the design of a logic circuit. The LBIST components include a set of scan chains interposed between portions of the functional logic of the circuit. The LBIST components also include means for setting specific input bits propagated through particular pieces of the functional logic. The bits are programmable, being set during some or all tests.

As noted above, an LBIST test typically involves executing a predetermined number of test loops and determining upon completion of the test whether a generated MISR signature matches an expected value (e.g. the signature value generated by a good device.) Usually, some number (e.g., 50) of LBIST tests will be performed on each production device to identify faults in the device. Each LBIST test generally uses a different seed for the pseudorandom bit pattern generator, and each test may apply a single weighting value to all of the scan chains (controlling the proportion of 1's and 0's in the bit patterns). Even though the weighting values can increase the likelihood that a bit loaded into a particular scan latch is a 1 (or 0,) the bit value is still pseudorandom, so the likelihood that an entire sequence of bits (e.g., input to a many-input AND gate) will have desired values (e.g., all 1's) is very low. Each LBIST test may use a different seed value and/or weighting value to improve fault coverage. These seeds and weighting values are typically determined by a user based on his or her experience.

It should be noted that the "many-input" logic gates referred to herein need not have a particular minimum number of inputs. As explained above, the significance of many-input logic gates in the present disclosure is that these gates are typically constructed by cascading multiple tiers of two-input logic gates and consequently require increased amounts of time (in comparison to two-input gates) for input data to propagate to their respective outputs. Because of the increased propagation time, it is sometimes impossible or impractical to insert additional logic gates before many-input gates for test purposes.

The present systems and methods, unlike conventional systems and methods, therefore enable the use of nonrandom bits within an otherwise random patterns of bits. This allows each LBIST test to achieve more effective fault coverage by allowing the input test bit patterns to be tailored to exercise certain logic elements/components while benefiting from the use of pseudorandom input patterns. It is therefore necessary to provide the means to set specific bits to test certain logic components.

In one embodiment, a pseudorandom bit pattern generator (PRPG) is coupled to the input scan chains through means to force specific bits to predetermined values (e.g., 1's). As an input bit pattern is scanned into a scan chain, at the appropriate cycle, the bit scanned into the chain is set to one. The bit is subsequently shifted into a latch coupled to an input of the component/element whose inputs are being forced to desired values. In another embodiment, a means to force bit values to desired values is located immediately prior to a set of M scan chain latches, each of which are coupled to the component/element whose inputs are to be controlled. During the last M shifts of a scan-shift phase, the bit shifted into the first of the set of M latches is set to the desired value. In another embodiment, means to force bit values to the desired value are located immediately prior to each of the scan latches coupled to the component/element whose inputs are to be controlled. Because of the improved fault coverage of each test, it is contemplated that fewer tests will be necessary than in prior art systems and methods.

Various embodiments of the invention will be described below. Primarily, these embodiments will focus on implementations of a STUMPS-type LBIST architecture which is implemented within an integrated circuit. It should be noted that these embodiments are intended to be illustrative rather than limiting, and alternative embodiments may be implemented in BIST architectures other than the STUMPS architecture, and may also be implemented in circuits whose components are not strictly limited to logic components (e.g., AND gates, OR gates, and the like). Many such variations will be apparent to persons of ordinary skill in the art of the invention and are intended to be encompassed by the appended claims.

Referring to FIG. 1 a functional block diagram illustrating the principal operation of a simple STUMPS LBIST system is shown for one embodiment. The LBIST system is incorporated into an integrated circuit. In this figure, the functional logic of the integrated circuit includes a first portion 110 and a second portion 120. Functional logic 110 is, itself, a logic circuit having a plurality of inputs 111 and a plurality of outputs 112. Similarly, functional logic 120 forms a logic circuit having a plurality of inputs 121 and a plurality of outputs 122. Functional logic 110 is coupled to functional logic 120 so that, in normal operation, outputs 112 of functional logic 110 serve as inputs 121 to functional logic 120.

Each of the inputs to, and outputs from, functional logic 110 and 120 is coupled to a scan latch. The set of scan latches 131 that are coupled to inputs 111 of functional logic 110 is referred to as a scan chain. The latches are serially coupled together so that bits of data can be shifted through the latches of a scan chain. For example, a bit may be scanned into latch 141, then shifted into latch 142, and so on, until it reaches latch 143. More specifically, as this bit is shifted from latch 141 into latch 142, a second bit is shifted into latch 141. As a bit is shifted out of each latch, another bit is shifted into the latch. In this manner, a series of data bits can be shifted, or scanned, into the set of latches in scan chain 131, so that each latch stores a corresponding bit. Data can likewise be scanned into the latches of scan chain 132.

Just as data can be scanned into the latches of a scan chain (e.g., 131,) data can be scanned out of the latches of a scan chain. As depicted in FIG. 1, the latches of scan chain 132 are coupled to the outputs of functional logic 110. Each of these latches can store a corresponding bit that is output by functional logic 110. After these output bits are stored in the latches of scan chain 132, the output data bits can be shifted through the series of latches and provided as a computed output bit stream. Data can likewise be scanned out of the latches of scan chain 133. It should be noted that the structure illustrated in FIG. 1 does not show data being scanned into scan chain 133, or data being scanned out of scan chain 131. Alternative embodiments may be configured to scan data in and out of these scan chains.

The LBIST system of FIG. 1 operates basically as follows. Pseudorandom bit patterns are generated and are scanned into the scan chains (131, 132) that are coupled to the inputs of functional logic 110 and 120. The pseudorandom bit patterns that are stored in scan chains 131 and 132 are then propagated through the corresponding functional logic. That is, the bit pattern in scan chain 131 is propagated through functional logic 110, while the bit pattern in scan chain 132 is propagated through functional logic 120. Functional logic 110 and 120 process the inputs and generate a corresponding set of outputs. These outputs are captured (stored) in the scan chains (132 and 133) that are coupled to the outputs of the functional logic. The output bit patterns stored in scan chains 132 and 133 are then scanned out of these scan chains.

Figure 2:
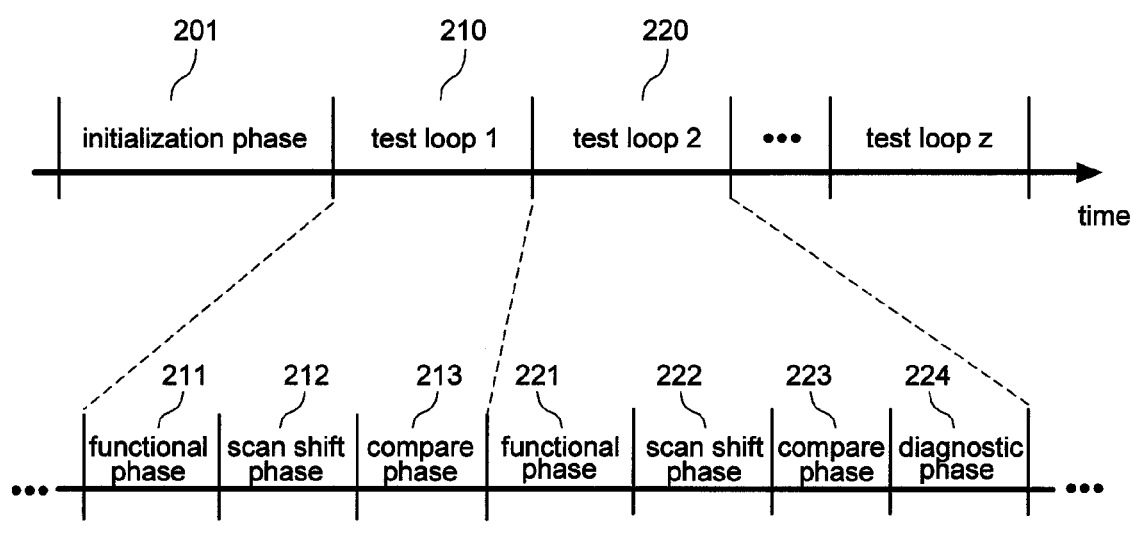
FIG. 2 is a diagram illustrating the phases of operation of an LBIST system in accordance with one embodiment.

Referring to FIG. 2, a diagram illustrating the phases of operation for an LBIST system in accordance with one embodiment is shown. FIG. 2 shows four different phases of operation: initialization; functional; scan-shift; compare; and diagnostic. As a shown in the FIG. 2, operation of the LBIST system begins with initialization phase 201. The various components of the system are prepared for normal operation during this phase. It may be necessary to ensure that several registers (e.g., PRPG seed, test counter, scan-shift counter) have the appropriate values stored therein. Because the first test loop (210) of the embodiment depicted in FIG. 2 begins with a functional phase (211,) it is also necessary in the initialization phase to generate a first set of pseudorandom bit patterns and to load these bit patterns into the scan chains that are interposed between the functional logic of the device under test. After these initial operations are performed, the LBIST system is ready for operation.

Following initialization phase 201, the LBIST system begins a first test loop 210 that includes functional phase 211, a scan shift phase 212, and a compare phase 213. At the end of a functional phase, the resulting captured data is scanned out of the scan chains and examined (during the subsequent compare phase.) During the compare phase of a test loop (e.g., 213, 223), data that is scanned out of the scan chains is examined to determine if an error occurred. If necessary, the LBIST testing may be suspended, or halted, to enable diagnosis of malfunctions using the available data in a diagnostic phase such as 224. A diagnostic phase (224) may include only data forwarding, or it may include an iterative set of phases designed to localize a defect that gave rise to the error. If the examination of the MISR signature or other data indicates that the functional logic of the device under test operated properly during the first test loop 210, the system proceeds to a second test loop 220 (again beginning with a functional phase) and continues until the requisite test termination conditions (e.g., detection of an error or completion of a predetermined number of test loops) are met.

During functional phases 211 and 221, data that was scanned into the scan chains (during initialization 201 or scan-shift 212, respectively) is propagated through the functional logic of the device under test. After some interval (e.g., one clock cycle) the resulting data is captured in the scan chains. (As noted above, a scan chain that is positioned between successive functional logic blocks serves to both provide inputs to one of the functional logic blocks and capture the outputs of the other functional logic block.) Thus, at the end of a functional phase, the output of the functional logic resides in the scan chains. The data that is captured in the scan chains at the end of the functional phase is then scanned out of the scan chains during the following scan-shift phase (e.g., 212 and 222.) At the same time the captured data is scanned out of the scan chains, input bit patterns are scanned into the scan chains to prepare for the functional phase of the next test loop.

The captured data is scanned out of the scan chains, typically into multiple input signature registers (MISR's). MISR's are configured to generate test signatures by combining the data received from the scan chains. The set of bits in each MISR (the MISR signature) is therefore dependent upon the bits that are received form the scan chains. The MISR signature of the device under test can be compared to that generated by a device that is known to function properly. If the signatures do not match, the device under test has malfunctioned.

Figure 3:
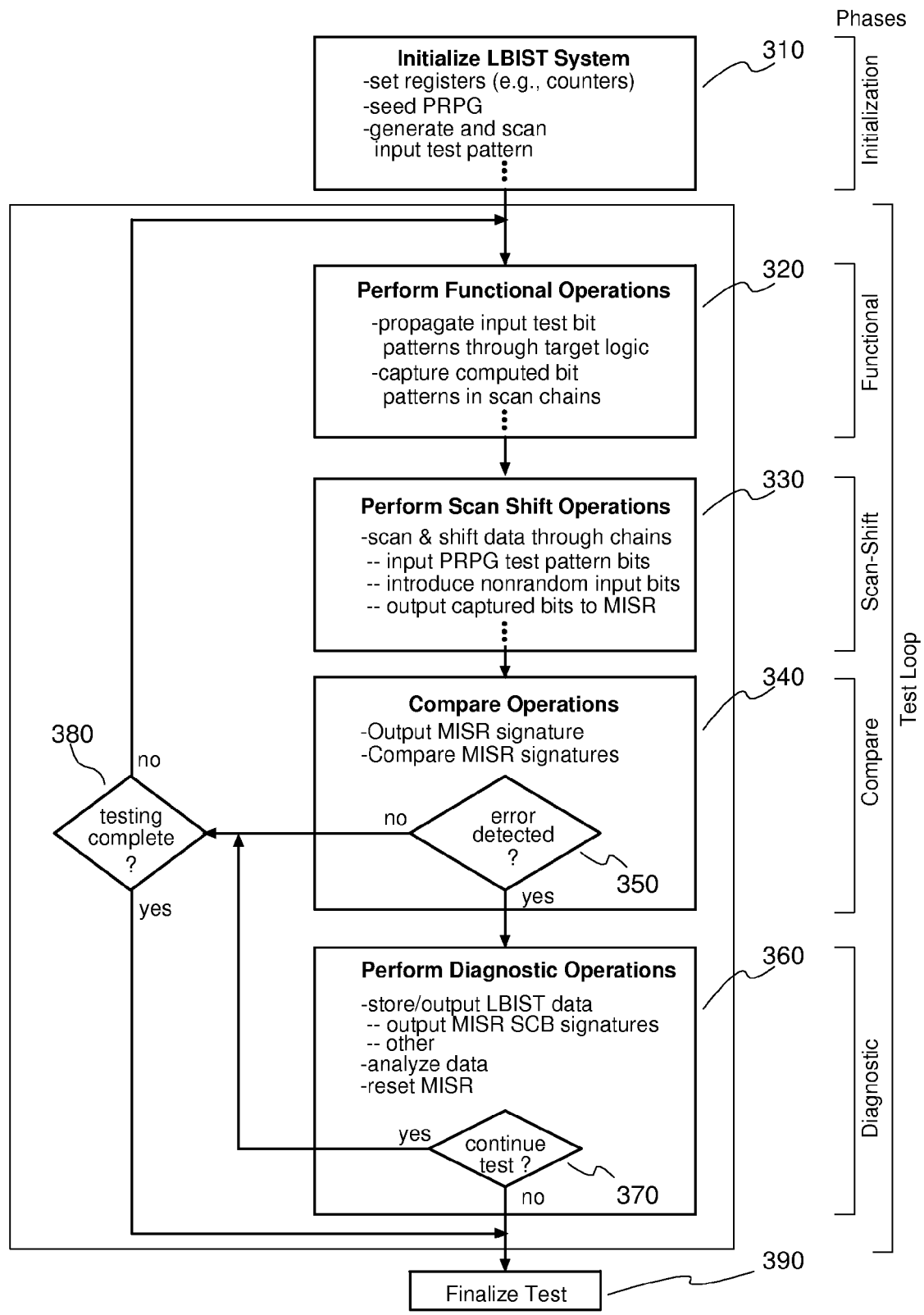
FIG. 3 is a flow diagram illustrating operations in accordance with one embodiment.

The operation of an exemplary LBIST system is summarized in FIG. 3. This figure is a flow diagram illustrating the initialization of the system and the repeating test loops that are performed in one embodiment. Also noted are the forcing of certain the bits to one (1) to ensure testing of specified logic components/elements.

Referring to FIG. 3, operation of the system of one embodiment begins with the initialization of the LBIST components (block 310.) This includes initialization of the PRPG that is used to produce pseudorandom input bit patterns for testing. The initialization also includes an initial scan shift phase to store a pseudorandom input bit pattern in the scan chains, since a functional phase immediately follows initialization. After the system is initialized, a functional phase (block 320) is executed, including propagating input patterns from the scan chains through the functional logic and capturing the resulting bit patterns in the scan chains. Next, the system executes a scan shift phase (block 330) in which each of the bits of the captured bit patterns are scanned out of the scan chains. At the same time, the bits of an input bit pattern are scanned into the scan chains in preparation for the next functional phase. As needed, any nonrandom bit sequences are introduced into the input pattern/latches. For example, as will be described in greater detail later, during the last cycle of the scan shift phase a forcing signal is asserted and ones (1) are set in all of a certain set of scan chain latches. The captured bits scanned out of a particular block's scan chains are used to update the MISR signature bits. Next, the MISR signature data is output and compared (350) with the corresponding signature data of a good device during the compare phase (block 340). During the compare phase the functional and scan shift operations of the system are suspended. If no difference is detected between the signature data of the good device and the device under test, the system continues by entering the next test loop (350 to 380 to 320.) If all test loops have been performed, the testing terminates (380 to 390.)

Figure 4:
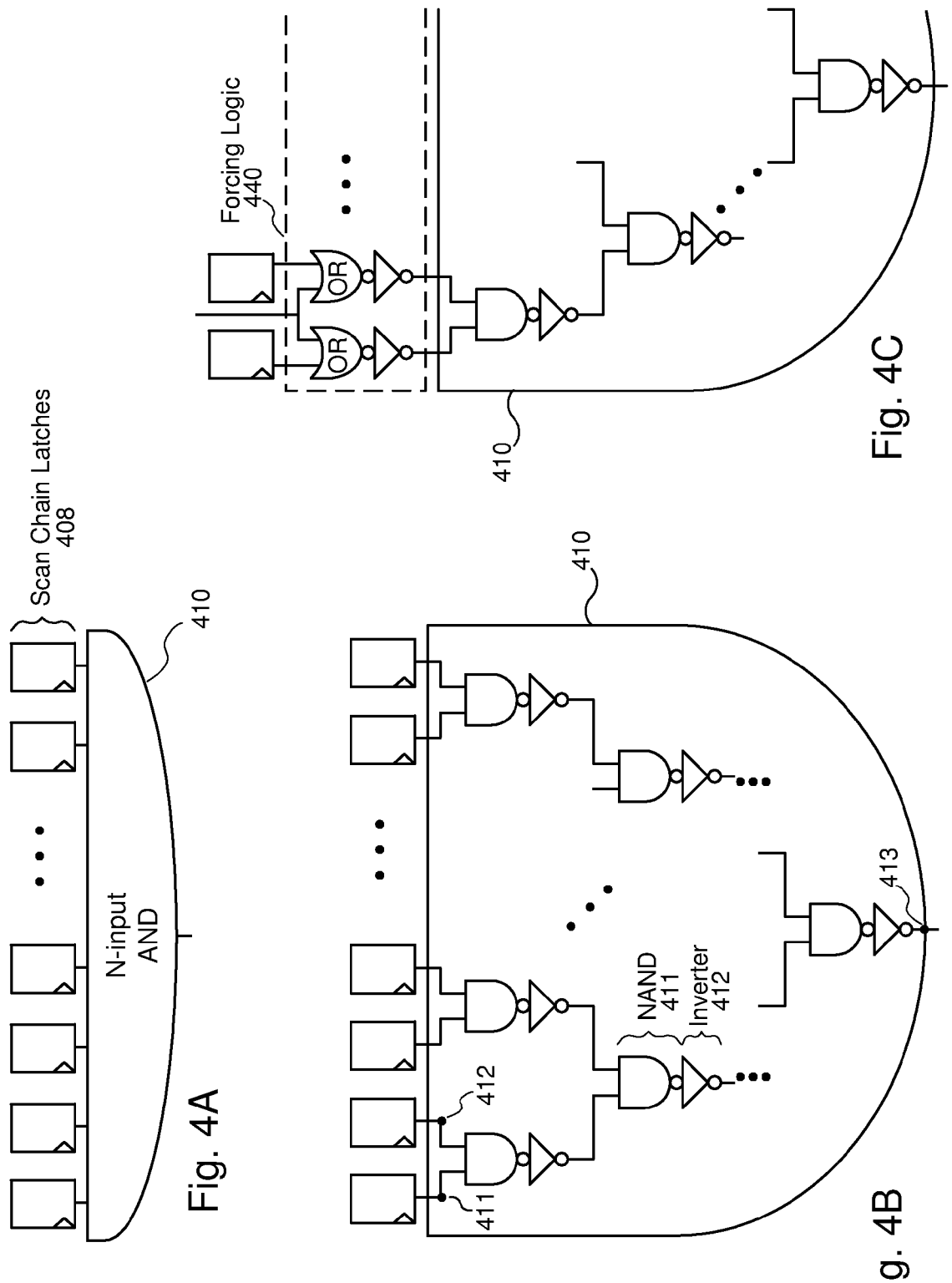
FIGS. 4A-4C are diagrams illustrating the implementation of a many-input AND gate with LBIST components that may violate timing constraints.

Some components or portions of the circuitry may require a very specific and improbable combination of bits to properly test the circuitry. For example, "large" (many-input) gates give rise to concerns regarding the likelihood that all output states will be exercised during testing. Illustrated in FIGS. 4A-4C is a block diagram of an exemplary large, N-input AND gate. FIG. 4A shows the coupling of the AND gate to a set of scan latches. FIG. 4B shows the internal structure of the AND gate. FIG. 4C shows the use of forcing logic that increases the propagation time between scan chains and may therefore violate timing constraints. The N-input AND gate 410 is coupled to N scan chain latches 408. (AND gate 410 actually comprises a set of cascaded two-input AND gates, each of which is implemented in FIG. 4B as a NAND gate and a corresponding inverter, e.g., 411 and 412, respectively.) Using random input patterns with an equal likelihood of 1's and 0's, the inputs of the N-input AND gate will all be 1's in only one out of 2**N input patterns. For example, with 8 inputs, the probability that all eight inputs are 1's (therefore resulting in an output of 1) is one in 256. An inordinately large number of tests might therefore be necessary to ensure the needed level of fault coverage.

As shown in FIG. 4C, logic to force the inputs of N-input AND to ones may be located in the functional path, between the outputs of scan chain latches 408 and the inputs of N-input AND 410 (e.g. at points 411 and 412). This placement increases by two levels, the number of levels of logic between the scan chain latches and the output of AND 410 (e.g., between points 411 and 413). When the entire timing budget is already used to traverse the logic of AND 410, the additional logic (440) forces the output of AND 410 to fall in the next functional cycle. This may have adverse effects not only on the testing but on the normal operations of the circuitry. The various embodiments of the invention therefore provide alternative means to force the input of components such as AND 410 to desired values.

Figure 5:
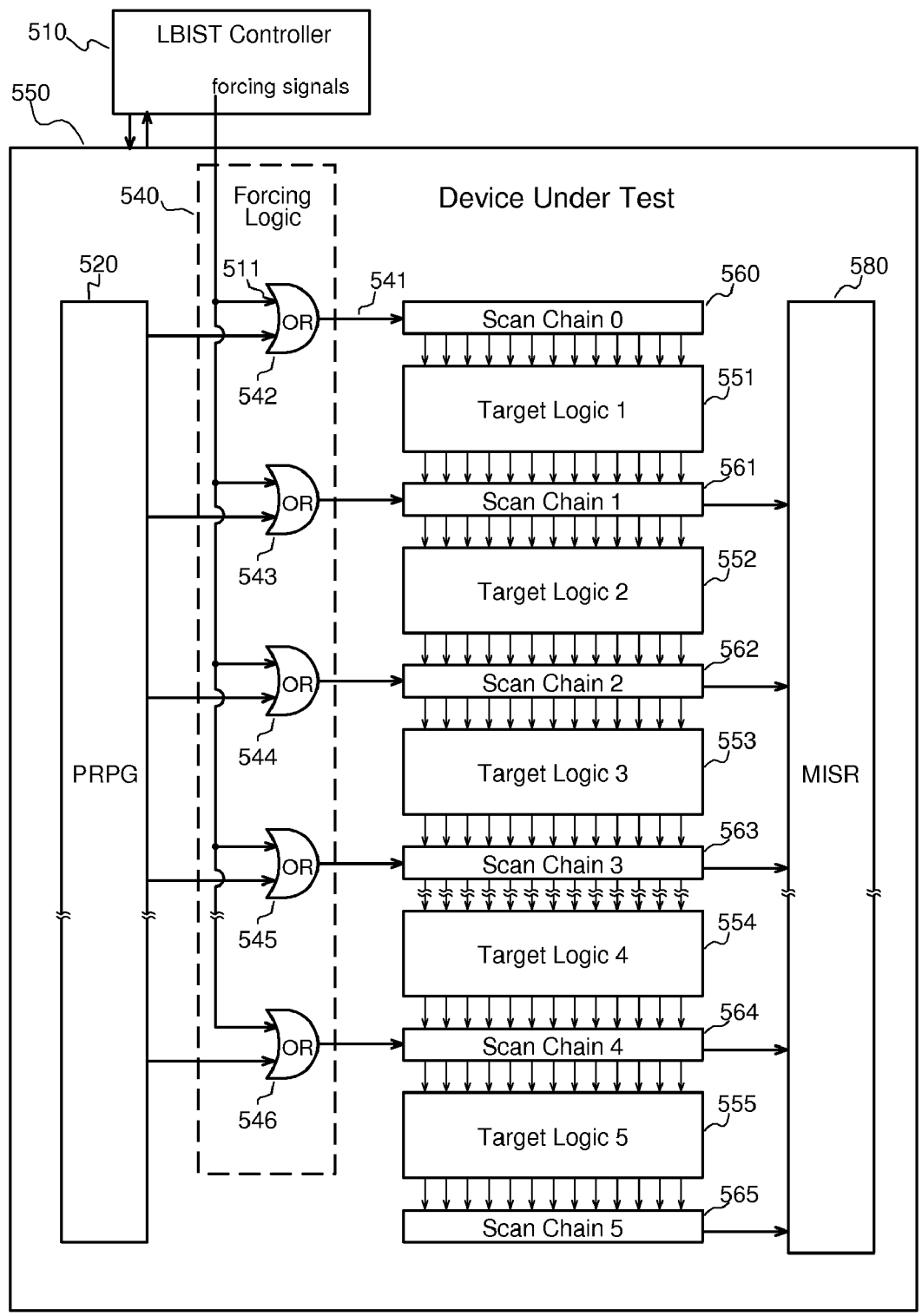
FIG. 5 is a functional block diagram illustrating the layout of a system in accordance with one embodiment.

Referring to FIG. 5, a block diagram illustrating the layout of an LBIST system in accordance with one embodiment is shown. The LBIST system of FIG. 5 utilizes scan chains as described in FIG. 1, and implements forcing logic 540 to alter the scan chain input bit patterns. The system operates basically as follows. Bits from a PRPG form a bit pattern for each scan chain. The pattern is scanned into the scan chain, and at the appropriate scan-shift cycle or cycles, a forcing signal is asserted to ensure that certain bits are ones. The altered scan chain input bit pattern is then propagated through the input ports of the functional logic coupled to the scan chain. The functional logic processes the inputs and generates a corresponding set of outputs that are captured in the scan chain coupled to the output ports of the functional logic. The output bit patterns are then scanned out of each scan chain and combined into a signature by a MISR.

In one embodiment, the LBIST system is implemented as shown in the functional block diagram of FIG. 5. The LBIST system implements a STUMPS architecture that comprises an LBIST controller 510, a PRPG 520, bit pattern forcing logic 540, a set of scan chains 560-565 and a MISR 580. These LBIST components are integrated with target logic circuits 551-555 (within an IC 550), which the LBIST components are designed to test.

LBIST controller 510 includes control circuitry that controls the operation of the forcing logic and the remainder of the LBIST components. LBIST controller 510 generates the control signals necessary to execute the phases of operation depicted in FIG. 2. For purposes of clarity, LBIST controller 510 is depicted as being coupled to the IC and LBIST components of IC 550 as a group, although the controller is typically coupled directly to each of the components. One of the functions of LBIST controller 510 is to provide a seed value to PRPG 520. Based on the seed value, PRPG 520 generates a pseudorandom sequence of bits that provide input bit patterns loaded into scan chains 560-564. Scan chain latch values can be set as well by forcing logic 540, depicted here at the heads of the scan chains.

The pseudorandom bit patterns generated by PRPG 520 and any bits set by forcing logic 540 are loaded into scan chains 560-564. Each of the forcing ORs 542-546 receives a signal from the LBIST controller to independently set bits within their respective scan chains. Each scan chain comprises a series of scan latches that are configured to alternately shift data (the pseudorandom bit patterns and functional logic output) through the scan chains, or to hold data that has been propagated through the functional logic. As indicated above, a separate sequence/pattern is loaded into each of scan chains 560-565. Each of scan chains 560-565 is positioned before or after (interposed with) respective blocks of target logic 551-555 of logic circuit 550. Thus, for each block of target logic circuit 551-555, there is a scan chain (560-564) that precedes this portion and provides inputs to the corresponding logic, as well as a scan chain (561-565) that follows this portion and receives the output of the corresponding logic.

For example, consider a sequence of pseudorandom bits from PRPG 520 fed to forcing OR 542. Consider that scan chain 560 latches 10-17 are coupled to a logic component/element that needs a sequence of eight ones (11111111) to be properly tested. The test would rely on the LBIST controller asserting a forcing signal via 511 on shifts 10-17 to set a value of one at each of the positions 10-17 as the input bit pattern is scanned into scan chain 560. Target logic 551 (including the component/element coupled to latches 10-17) receives input bits from scan chain 560 and provides output bits to scan chain 561. The output bits are then scanned out of scan chain 561 into MISR 580. Similarly, target logic 552-555 receives input bits from scan chains 561-564 and provides output bits to scan chains 562-565. Scan chains 561-564 serve both to provide input bits to a succeeding block of target logic and to receive output bits from a preceding block of target logic. Scan chain 560 only provides input bits and scan chain 565 only captures/stores output bits.

The purpose of the pseudorandom sequence of bits generated by PRPG 520 is to provide a set of input bits to be propagated through the functional logic components of integrated circuit 550. In the absence of forcing logic 540, a bit in the bit sequences provided to each of the scan chains would, on average, has the same probability of being a zero or one. The purpose of forcing logic 540 is to change the input pattern so that the value of each of a set of specific input bits is one, thereby improving test coverage. If the component coupled to the latches of the forced bits (or other logic) malfunctions and the failure propagates into the MISR, the MISR signature will reveal the malfunction. It is possible that a malfunction may not manifest itself in the signature which requires a number of tests ensure that the malfunction is detected.

Figure 6:
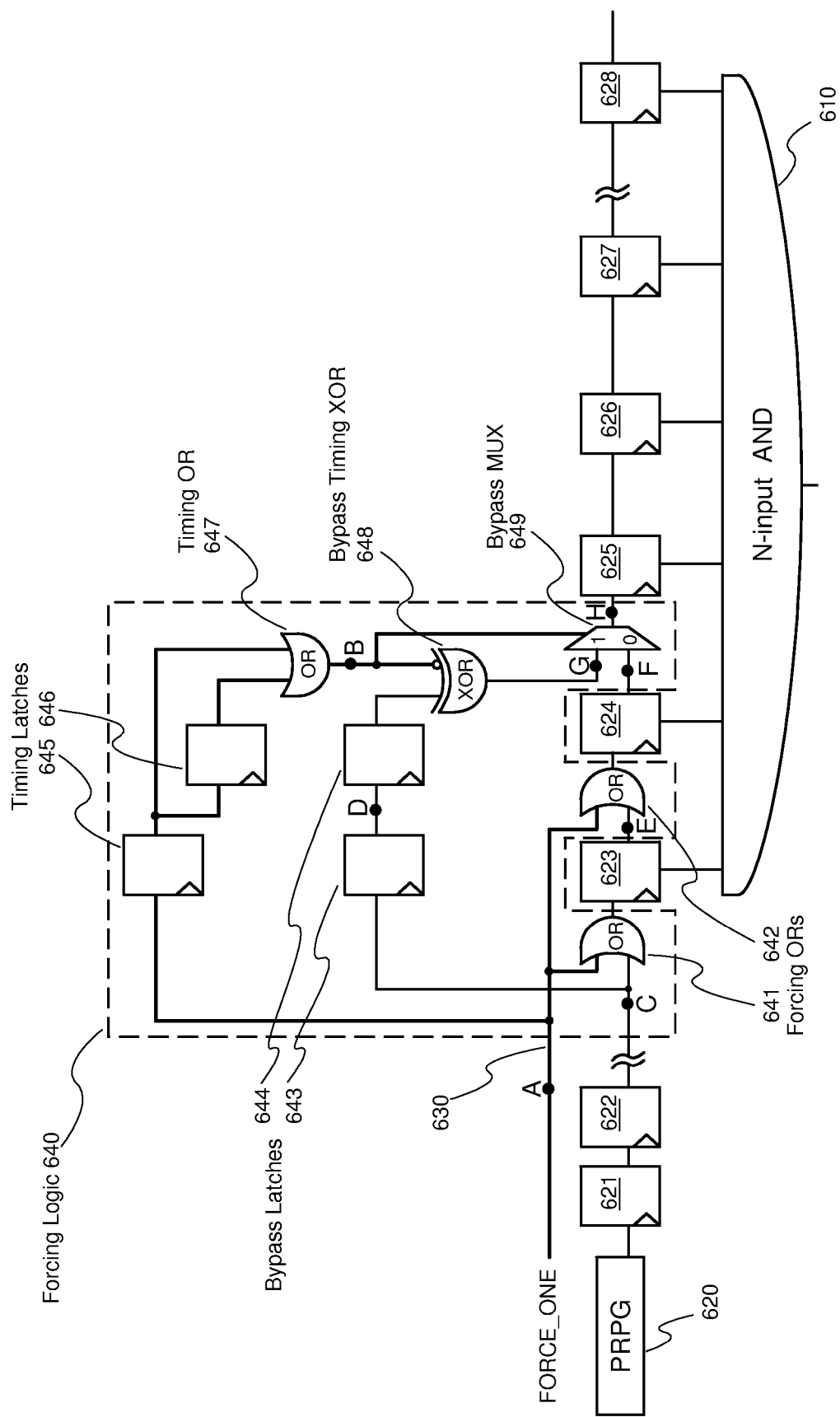
FIG. 6 is a diagram illustrating the implementation of forcing logic in accordance with one embodiment.

Another exemplary embodiment of the forcing logic is illustrated in FIG. 6. In this embodiment, logic is provided to force the values of two latches in a scan chain to 1. Bypass logic is also provided so that the bit pattern provided to latches downstream from the forced latches in the scan chain receive the bit pattern originally shifted into the scan chain from the PRPG. An accompanying timing diagram appears in FIG. 7 which shows the values of signals at points A through H in the circuit of FIG. 6 for an interval of time.

The LBIST system of FIG. 6 comprises PRPG 620, a scan chain (latches 621-628), and bit pattern forcing logic 640. These LBIST components are integrated with target functional logic which they are designed to test. In this embodiment, the target functional logic includes the illustrated N-input AND 610. For simplicity, the connections of each of the latches to the surrounding functional logic and LBIST controller are not illustrated.

The forcing logic illustrated in FIG. 6 comprises forcing signal input 630, forcing OR gates 641-642, bypass latches 643-644, timing latches 645-646, timing OR gate 647, bypass timing XOR gate 648, and MUX 649. Forcing logic 640 is coupled to forced latches 623 and 624. Within forcing logic 640, OR gates 641 and 642 serve to force the values in latches 623 and 624 to 1's. Latches 643 and 644, XOR gate 648 and MUX 649 serve to provide a bypass path for the unaltered bits of the pattern generated by the PRPG. Latches 645 and 646, and OR gate 647 serve to provide timing to control selection of the bypass or normal scan paths.

This system is designed so that, when signal FORCE_ONE is asserted on line 630, a 1 is read into the forced latches from forcing OR gates 641 and 642. When FORCE_ONE is not asserted, forced latches 633 and 634 are loaded with the unaltered bits of the pseudorandom input bit pattern received from PRPG 620 through the preceding latches (e.g., 621 and 622.) A bypass path is provided so that the bits passed to subsequent latches (latches following the forced latches in the scan chain) receive the unaltered bit pattern generated by PRPG 620.

During a scan shift phase of a test loop, a pseudorandom input bit pattern generated by the PRPG is shifted into the scan chain latches, beginning with latches 621-622. If the forcing signal FORCE_ONE is never asserted, forcing OR gates 641 and 642 simply pass through the bit from the preceding scan latch to the following scan latch. Bypass MUX 649 likewise passes the bit from the preceding scan latch (624) to the following scan latch (625), since the control input (the signal at point B) is 0. As a result, the input bit pattern simply shifts through the scan chain latches. That is, the bits originating in PRPG 620 shift through latch 621, latch 622, latch 623, and so forth through latch 628, unaltered. The pseudorandom input bit pattern is therefore completely loaded into all of the scan chain latches as if forcing logic 640 were not present.

When the forced latches are to be forced to 1, the pseudorandom input bit pattern is generated by the PRPG and shifted through the scan chain latches as described above until the signal FORCE_ONE is asserted. When asserted for one cycle, 1's are loaded into forced latches 623 and 624. While 1's are loaded into the forced latches, the original bit pattern generated by the PRPG is loaded into bypass latches 643-644. When signal FORCE_ONE is asserted, the first timing latch 645 is set to 1. At the next scan-shift cycle, this 1 is applied to one of the inputs of timing OR gate 647. The 1 passes through OR gate 647 and is applied to the control input of bypass MUX 649, causing the MUX to select the bypass path (i.e., bypass XOR gate 648) instead of the preceding latch (624) in the scan chain. In this cycle, a 1 is also loaded into timing latch 646. In the following cycle, the 1 from latch 646 will be applied to the second input of timing OR gate 647, causing it to pass a 1 to the control input of MUX 649 for a second cycle. Thus, for the two cycles following assertion of signal FORCE_ONE, the bypass path will be selected by MUX 649, allowing the unaltered bits of the PRPG-generated pattern to be shifted into latch 625 and subsequent latches in the scan chain.

It should be noted that that, in this embodiment, the bypass path will be selected for the two cycles following any cycle in which FORCE_ONE is asserted. That is, the bypass path will be selected beginning with the first cycle after FORCE_ONE is asserted and will continue to be selected until one cycle after FORCE_ONE is deasserted. For example, if FORCE_ONE is asserted for one cycle and then deasserted, the bypass path will be selected for two cycles, and then the normal scan chain path will be selected. If FORCE_ONE is asserted for N cycles and then deasserted, the bypass path will be selected for N+1 cycles, and then the normal scan chain path will be selected. It should also be noted that the purpose of bypass XOR gate 648 is to invert the bits in the bypass path when the bypass path is not selected by MUX 649. This provides a mechanism for identifying defects that cause incorrect selection of the bypass path. The bypass XOR gate can therefore be removed without affecting the forcing or bypass functions.

In one embodiment, line 630 is tied to one of the latches (e.g., 621) in the scan chain. FORCE_ONE is therefore asserted (or deasserted) according to the value in that scan latch. The forced latches (623 and 624 are therefore forced to 1's according to a pseudorandom pattern defined by the PRPG-generated bit pattern. It should be noted that, while the embodiment of FIG. 6 forces two of the scan latches to values of 1, this structure can be extended to different numbers of latches in alternative embodiments. For example, one embodiment may force all of the N inputs of an N-input AND gate to 1's. It should also be noted that, if less than N latches at the inputs of an N-input AND gate are forced to 1's, the likelihood that all of the inputs will be 1's increases, but all 1's is not a certainty.

The timing diagram of FIG. 7 describes how the example input bit pattern "a b c d e f g h i" propagates through the circuitry of the embodiment of FIG. 6. The circuitry is sampled at the points labeled A-H in FIG. 6 from time steps 1 through 9 as indicated in FIG. 7. The forcing signal (see point A) is asserted at time step 4. The timing delay involving the two timing latches and timing OR result in a 1 at point B on the subsequent time steps 4 and 5 (allowing the bypass values "c d" through the bypass MUX to point H). The PRPG input bit pattern "a b c d e f g h i" passes point C, at time steps "1 2 3 4 5 6 7 8 9", respectively. One time step later, after the first bypass latch, the PRPG input bits "a b c d e f g h" pass point D at time steps "2 3 4 5 6 7 8 9", respectively. The values of the second bypass latch are negated "~a ~b ~e ~f ~g" as seen at point G when blocked by the bypass MUX at time steps "3 4 7 8 9". The PRPG input bits "a b c e f g h i" pass point E at time steps "2 3 4 6 7 8 9", respectively. At time step "5", at the time step when the forcing signal is asserted, the value is 1. The PRPG input bits "a b e f g" pass point F at time steps "3 4 7 8 9", respectively. At time steps 5 and 6, at the time step when the forcing signal is asserted and the step following the assertion step, the value is 1, and is blocked at the bypass MUX at these time steps. At these time steps, 5 and 6, the values "c" and "d" at point G pass through the bypass MUX to point H. The result for time steps "3 4 5 6 7 8 9" at point G is a combination of values from points F and G of "a b c d e f g". That is, the result is that the PRPG input bit pattern passes point H unaltered and is timed as if there were no forcing logic. At the same time, the bits entering the N-input AND from latches 623 and 624 can be (and are) forced to 1.

Various alternative embodiments are possible and some preferred over others depending on the particular application or design constraints. Illustrated in FIGS. 8A-8D are block diagrams of forcing logic for LBIST systems in accordance with four alternative embodiments. Each embodiment has scan chain latches to convey input bit patterns to functional logic. Each embodiment has N of the latches coupled to the inputs of an N-input AND gate. (It should be noted that the structures can also be adapted to provide other forced values, such as all 0's for an N-input OR gate as shown in FIG. 9, or various specific combinations of 1's and 0's for other logic.) The connections of each of the latches to the surrounding functional logic, LBIST controller, etc., are not illustrated for the sake of simplicity.

Figure 8A:
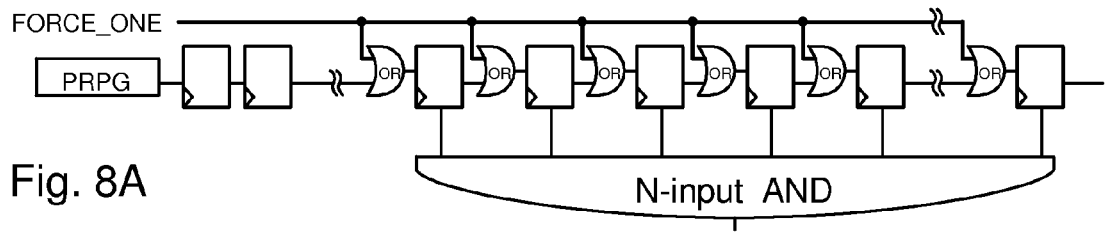
FIGS. 8A-8D are diagrams illustrating the implementation of forcing logic in accordance with alternative embodiments.
Figure 8B:
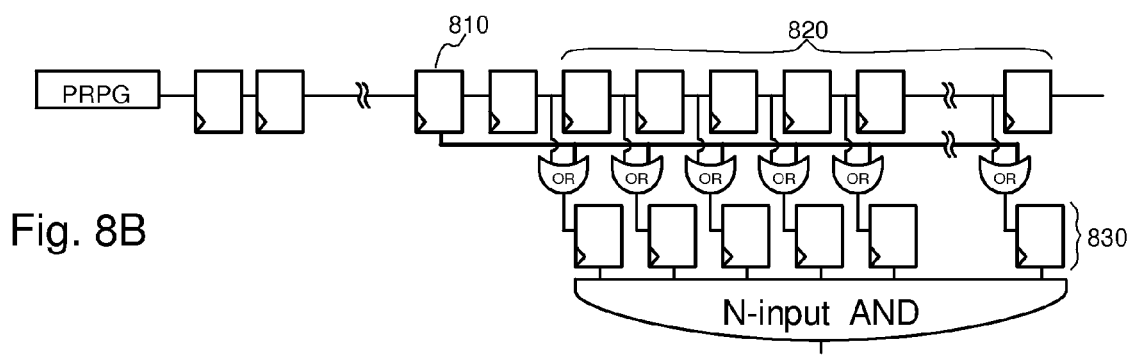
Figure 8C:
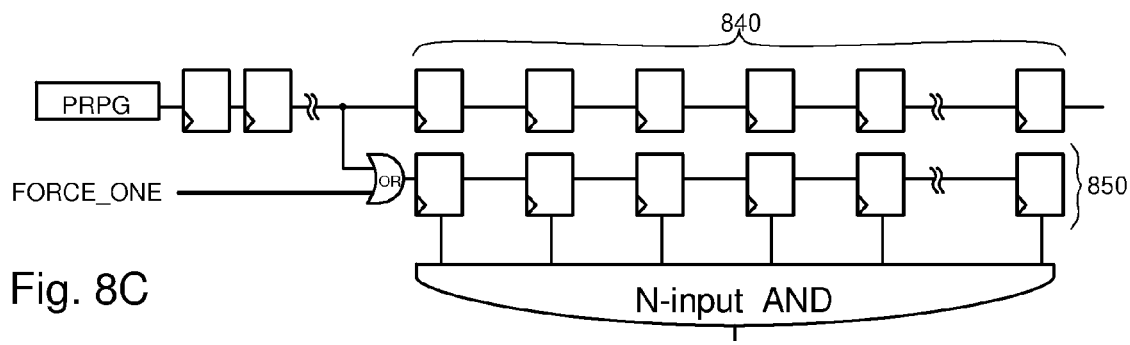
Figure 8D:
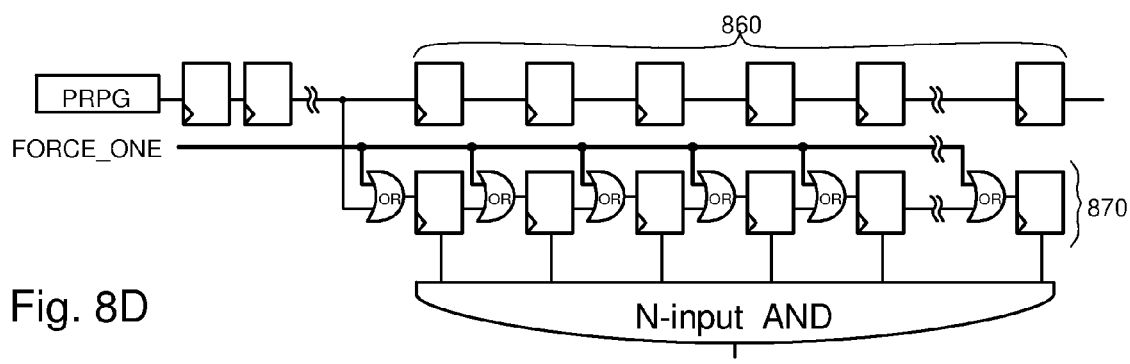
Figure 9:
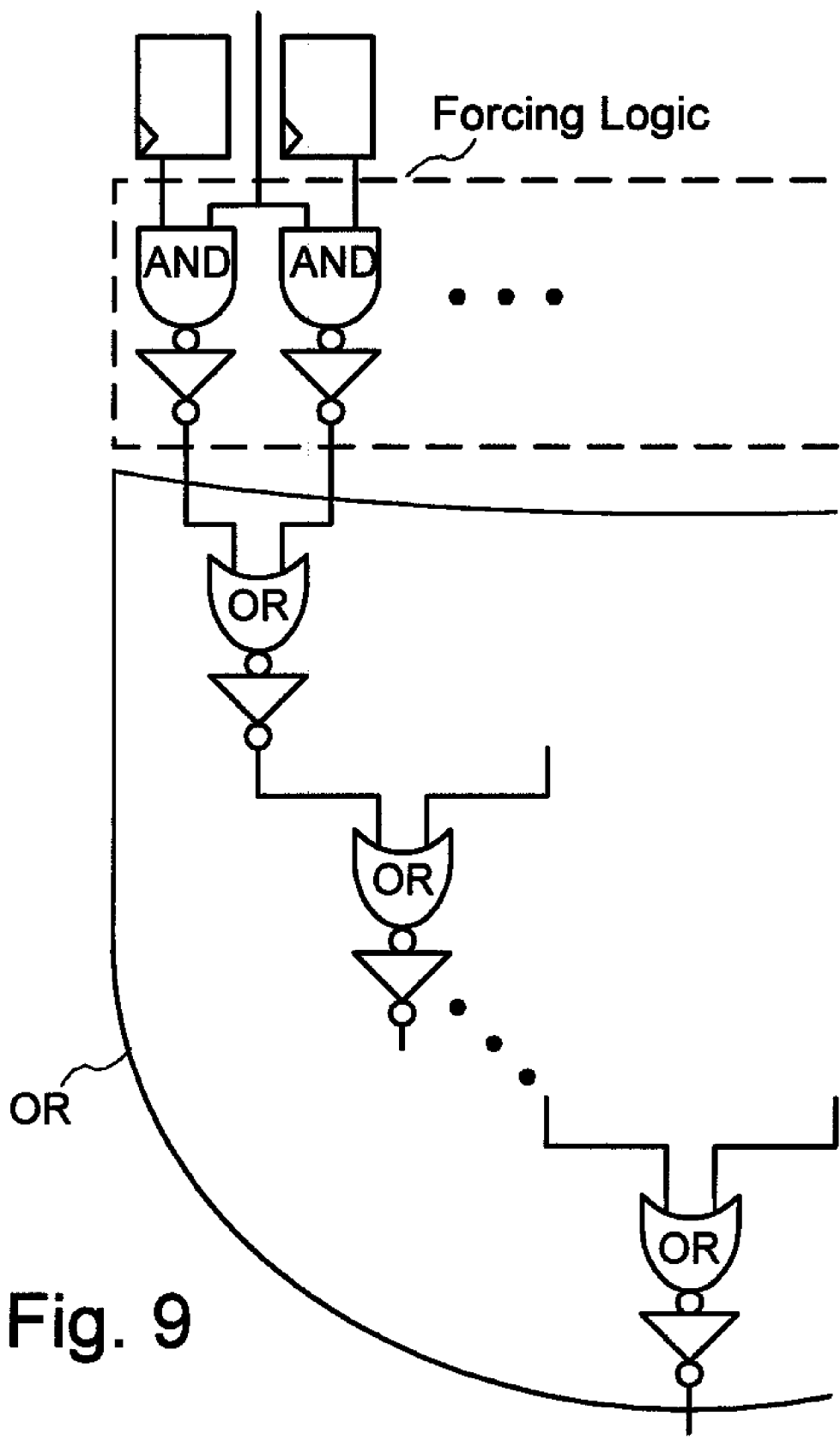
FIG. 9 is a diagram illustrating the implementation of forcing logic in an N-input OR gate in accordance with an alternative embodiment.

The embodiment of FIG. 8A has N OR gates coupled between the N latches at the inputs of the AND gate. When FORCE_ONE is asserted, each of the latches at the inputs of the AND gate is loaded with a 1. No bypass mechanism is provided in this embodiment to allow the original bit pattern to be provided downstream of the forced latches after FORCE_ONE is asserted. In the embodiment of FIG. 8B, the latches in the scan chain (e.g., 820) retain the bit pattern originally generated by the PRPG, while the forced latched form a second set of latches, mirror latches (e.g., 830), which actually provide the inputs to the AND gate. As an alternative to FORCE_ONE being provided by the LBIST controller, FIG. 8B uses scan chain latch 810 as an input to its N OR gates. If the value of latch 810 is 0 (i.e., a signal is not asserted), the second set of latches mirrors the first set. If, on the other hand, the value in latch 810 is 1 (i.e., a signal is asserted), the second set of latches are forced to 1. In the embodiments of FIG. 8C-8D, the a first set of latches in the scan chain (e.g., 840 and 860, respectively) retain the bit pattern originally generated by the PRPG. Mirror latch sets 850 and 870, respectively, are the forced latches, and actually provide the inputs to their respective AND gates. In both embodiments, if FORCE_ONE is not asserted, the second set of latches mirrors the first set. In the embodiment of FIG. 8C, FORCE_ONE is asserted for the last N scan cycles to force each of the mirror latches to 1. In the embodiment of FIG. 8D, FORCE_ONE is asserted for the last scan cycle to force each of the mirror latches to 1.

The embodiment of FIG. 9 is essentially the same as is shown in FIG. 4C, except that the many-input AND gate of FIG. 4C (the target logic) is replaced by a many-input OR gate as mentioned above. The forcing logic in FIG. 9 consists of AND gates coupled between the scan latches and the inputs of the OR gate. Each AND gate is configured to receive a forcing signal and an output of a scan latch as inputs. When the forcing signal is asserted, the AND gates provide 0's to the inputs of the OR gate.

While the foregoing description presents several specific exemplary embodiments, there may be many variations of the described features and components in alternative embodiments. As noted above, the forcing logic may provide various combinations of inputs (e.g., all 1's, all 0's, or specific combinations of 1's and 0's.) The latches may be forced to specific values individually, of by forcing a value in a specific latch and then shifting that value to another latch. The forcing logic may or may not provide a bypass path, or the forced latches may be outside the scan chain. Many other variations will also be apparent to persons of skill in the art of the invention upon reading the present disclosure.

Those of skill in the art will understand that information and signals may be represented using any of a variety of different technologies and techniques. For example, data, instructions, commands, information, signals, bits, and symbols that may be referenced throughout the above description may be represented by voltages, currents, electromagnetic waves, magnetic fields or particles, optical fields or particles, or any combination thereof. The information and signals may be communicated between components of the disclosed systems using any suitable transport media, including wires, metallic traces, vias, optical fibers, and the like.

Those of skill will further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Those of skill in the art may implement the described functionality in varying ways for each particular application, but such implementation decisions should not be interpreted as causing a departure from the scope of the present invention.

The various illustrative logical blocks, modules, and circuits described in connection with the embodiments disclosed herein may be implemented or performed with application specific integrated circuits (ASICs,) field programmable gate arrays (FPGAs) or other logic devices, discrete gates or transistor logic, discrete hardware components, or any combination thereof designed to perform the functions described herein.

The steps of a method or algorithm described in connection with the embodiments disclosed herein may be embodied directly in hardware, in software (program instructions) executed by a processor, or in a combination of the two. Software may reside in RAM memory, flash memory, ROM memory, EPROM memory, EEPROM memory, registers, hard disk, a removable disk, a CD-ROM, or any other form of storage medium known in the art. Such a storage medium containing program instructions that embody one of the present methods is itself an alternative embodiment of the invention. One exemplary storage medium may be coupled to a processor, such that the processor can read information from, and write information to, the storage medium. In the alternative, the storage medium may be integral to the processor. The processor and the storage medium may reside, for example, in an IC.

The benefits and advantages which may be provided by the present invention have been described above with regard to specific embodiments. These benefits and advantages, and any elements or limitations that may cause them to occur or to become more pronounced are not to be construed as critical, required, or essential features of any or all of the claims. As used herein, the terms "comprises," "comprising," or any other variations thereof, are intended to be interpreted as non-exclusively including the elements or limitations which follow those terms. Accordingly, a system, method, or other embodiment that comprises a set of elements is not limited to only those elements, and may include other elements not expressly listed or inherent to the claimed embodiment.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein and recited within the following claims.

The invention claimed is:

1. An integrated circuit test system comprising:
a plurality of scan latches configured as a single scan chain, wherein each of the plurality of scan latches is coupled to a corresponding input of target logic, wherein the plurality of scan latches are configured to receive and store bit patterns; and
forcing logic coupled to a first set of the plurality of scan latches and configured to selectively force values stored in the first set of scan latches to desired values, wherein the desired values replace the values in the first set of scan latches, wherein the forcing logic comprises one or more logic gates coupled to the inputs of each of the first set of scan latches, wherein each logic gate is configured to receive as inputs a forcing signal and an output of a preceding one of the plurality of scan latches and to provide an output of the logic gate to a following one of the plurality of scan latches, wherein when the forcing signal is asserted, each of the first set of scan latches is loaded with a predetermined forced value.

2. The system of claim 1, wherein each of the logic gates is an OR gate, and wherein when the forcing signal is asserted, each of the first set of scan latches is loaded with a 1.

3. The system of claim 2, wherein the forcing signal comprises a value stored in a selected one of the scan latches.

4. The system of claim 1, wherein each of the logic gates is an AND gate, and wherein when the forcing signal is asserted, each of the first set of scan latches is loaded with a 0.

5. The system of claim 1, wherein the target logic comprises a many-input logic gate selected from the group consisting of: an AND gate; and an OR gate.

6. The system of claim 5, wherein the forcing logic is configured to selectively force loading of the desired values in all of the inputs of the many-input logic gate.

7. The system of claim 5, wherein the forcing logic is configured to selectively force loading of the desired values in a subset of the inputs of the many-input logic gate.

8. The system of claim 1, wherein the forcing logic comprises a bypass path configured to enable shifting of unaltered bit patterns around the first set of scan latches to subsequent scan latches when the values stored in the first set of scan latches are forced to the desired values.

9. The system of claim 8, wherein the forcing logic shifts the unaltered bit patterns through the first set of scan latches to subsequent scan latches when the values stored in the first set of scan latches are not forced to the desired values.

10. The system of claim 9, wherein when the values stored in the first set of scan latches are not forced to the desired values, bit values shifted out of the bypass path are inverted.

11. The system of claim 1, wherein the first set of scan latches comprise a set of mirror latches, wherein the bit patterns are shifted unaltered into a scan chain comprising unforced scan latches, and wherein each of the mirror latches is configured to store either a value in a corresponding one of the unforced scan latches or a desired value.

12. A method implemented in an integrated circuit test system comprising:
providing a plurality of scan latches configured as a single scan chain, wherein each of the plurality of scan latches is coupled to corresponding inputs of target logic;
shifting bit patterns into the plurality of scan latches;
providing one or more logic gates coupled to the inputs of each of a first set of scan latches, wherein each logic gate is configured to receive as inputs a forcing signal and an output of a preceding one of the plurality of scan latches and to provide an output of the logic gate to a following one of the plurality of scan latches, and
selectively forcing desired values into a first set of the plurality of scan latches, wherein the desired values replace the values in the first set of scan latches.

13. The method of claim 12, wherein each of the logic gates is an OR gate, and wherein forcing the desired values into the first set of scan latches comprises selectively asserting the forcing signal to load each of the first set of scan latches with a 1.

14. The method of claim 13, further comprising providing a value stored in a selected one of the scan latches as the forcing signal.

15. The method of claim 12, wherein each of the logic gates is an AND gate, and wherein forcing the desired values into the first set of scan latches selectively asserting the forcing signal to load each of the first set of scan latches with a 0.

16. The method of claim 12, wherein at least a portion of the scan latches are coupled to the inputs of a many-input logic gate selected from the group consisting of: an AND gate; and an OR gate.

17. The method of claim 16, wherein all of the inputs of the many-input logic gate are coupled to the first set of scan latches and wherein the method further comprises selectively forcing all of the inputs of the many-input logic gate to 1 when the many-input logic gate is an AND gate and to 0 when the many-input logic gate is an OR gate.

18. The method of claim 16, wherein a subset of the inputs of the many-input logic gate are coupled to the first set of scan latches and wherein the method further comprises selectively forcing the subset of inputs of the many-input AND gate to 1 when the many-input logic gate is an AND gate and to 0 when the many-input logic gate is an OR gate.

19. The method of claim 12, further comprising providing a bypass path around the first set of scan latches and shifting the unaltered bit patterns around the first set of scan latches to subsequent scan latches when the values stored in the first set of scan latches are forced to the desired values.

20. The method of claim 19, further comprising shifting the unaltered bit patterns through the first set of scan latches to subsequent scan latches when the values stored in the first set of scan latches are not forced to the desired values.

21. The method of claim 20, further comprising inverting bit values shifted out of the bypass path when the values stored in the first set of scan latches are not forced to the desired values.

22. The method of claim 12, further comprising providing a set of mirror latches as the first set of scan latches, shifting the bit patterns into a scan chain comprising unforced scan latches, shifting the bit patterns into the set of mirror latches and selectively forcing each of the mirror latches to a desired value while leaving the bit patterns in the unforced scan latches unaltered.

* * * * *